United States Patent [19]

Sierocuk et al.

[11] Patent Number: 4,644,276
[45] Date of Patent: Feb. 17, 1987

[54] THREE-DIMENSIONAL NUCLEAR MAGNETIC RESONANCE PHANTOM

[75] Inventors: Thomas J. Sierocuk, Waukesha; Robert W. Newman, Milwaukee, both of Wis.

[73] Assignee: General Electric Company, Milwaukee, Wis.

[21] Appl. No.: 650,956

[22] Filed: Sep. 17, 1984

[51] Int. Cl.⁴ ............................................. G01R 33/24
[52] U.S. Cl. .................................... 324/307; 324/300
[58] Field of Search .............. 324/300, 307, 308, 309, 324/312, 318, 320, 321; 128/653

[56] References Cited

U.S. PATENT DOCUMENTS 4,322,684 3/1982 Hounsfield .......................... 324/309
4,528,510 7/1985 Loeffler et al. ..................... 324/309
4,551,678 11/1985 Morgan ............................... 324/300

FOREIGN PATENT DOCUMENTS 58-150846 9/1983 Japan .
59-15844 1/1984 Japan .

Primary Examiner—Stewart J. Levy
Assistant Examiner—Kevin D. O'Shea
Attorney, Agent, or Firm—Alexander M. Gerasimow; Douglas E. Stoner

[57] ABSTRACT

Three-dimensional NMR phantom includes in the preferred embodiment a set of three mutually orthogonal test plates each configured to enable testing NMR scanner performance in each of the planes containing the plates. The plates are further arranged so as to be simultaneously positionable, in use, at the isocenter of the NMR scanner to permit testing NMR scanner performance in each plane without repositioning the phantom.

17 Claims, 4 Drawing Figures

THREE-DIMENSIONAL NUCLEAR MAGNETIC RESONANCE PHANTOM

BACKGROUND OF THE INVENTION

This invention relates to test devices, generally referred to as phantoms. More specifically, this invention relates to a phantom useful with nuclear magnetic resonance (NMR) scanner apparatus to carry out performance and calibration measurements in three dimensions without repositioning the phantom.

A phantom generally comprises a test object constructed to simulate structures and conditions encountered in actual use. In the case of medical diagnostic equipment, the phantom can be made to simulate various types of tissue and can be used as a substitute test object in operator training, as well as a calibration device to ascertain the level of equipment performance. In some cases, it is desirable to ascertain the degree of equipment operability by daily calibration procedures. The phantom, therefore, must be constructed to allow evaluation of multiple image quality parameters with relative ease and a minimum expenditure of operator time and effort. Accordingly, factors such as scan time to acquire the test data, phantom set-up time, phantom weight, and cost must be minimized. Conversely, factors such as realiability, repeatability and simplicity must be maximized.

Phantoms have been utilized in the past in such diagnostic modalities as transmission computed tomography (CT) and digital radiography. Phantoms for use with NMR apparatus, however, must meet different performance requirements than those of other modalities. This is due, at least in part, to the fact that NMR scanner operation is different from other modalities in that it is capable of detecting tissue parameters which are not measureable by any other means. Additionally, NMR has significantly longer imaging times, of the order of five minutes, than the afore-mentioned modalities, so that the need to optimize phantom performance is apparent. To better appreciate the unique requirements associated with NMR phantoms, it is beneficial to consider some fundamental NMR scanning principles.

By way of background, the nuclear magnetic resonance phenomenon occurs in atomic nuclei having an odd number of protons or neutrons. Due to the spin of the protons and the neutrons, each such nucleus exhibits a magnetic moment, such that, when a sample including such nuclei is placed in a static, homogeneous magnetic field, $B_o$, a greater number of nuclear magnetic moments align with the field to produce a net macroscopic magnetization M in the direction of the field. Under the influence of the $B_o$ magnetic field, the magnetic moments precess about the axis of the field at a frequency which is dependent on the strength of the applied magnetic field and on the characteristics of the nuclei. The angular precession frequency $\omega$, also referred to as the Larmor frequency, is given by the Larmor equation $\omega = \gamma B$, in which $\gamma$ is the gyromagnetic ratio which is constant for each NMR isotope and wherein B is the magnetic field acting upon the nuclear spins. It will be thus apparent that the precession frequency is dependent on the strength of the magnetic field in which the sample is positioned.

In order to observe an NMR signal, the orientation of magnetization M, normally directed along the magnetic field $B_o$, must be perturbed by the application of a magnetic field oscillating at the Larmor frequency so as to create a transverse magnetization component in a plane orthogonal to the field $B_o$. This is accomplished by applying a magnetic field, designated $B_1$, in a plane orthogonal to the direction of the static field $B_o$ by means of radio frequency (RF) excitation pulses through coils connected to RF transmitting apparatus. The effect of field $B_1$ is to rotate magnetization M in the volume of the object being studied which lies in the field of the RF coil. When the RF excitation is removed, magnetization M returns to its equilibrium position by a variety of processes and in the course of doing so, generates a detectable NMR signal.

While it is adequate for some purposes to simply detect the NMR signal originating from the entire volume lying within the field of the coil, it is frequently necessary to identify spatially where in the volume the NMR signal originates. One such application is in NMR imaging. Spatial localization is achieved by the application of the $G_x$, $G_y$ and $G_z$ magnetic-field gradients directed along the x, y, and z axes of the conventional Cartesian coordinate system. The gradients are generally of the form $$G_x(t) = \partial B_o / \partial x$$

$$G_y(t) = \partial B_o / \partial y$$

$$G_z(t) = \partial B_o / \partial z$$

The $G_x$, $G_y$, and $G_z$ gradients are constant throughout the imaging volume, but their magnitudes are typically time dependent. The gradients are utilized with radio frequency excitation pulses in various imaging techniques, such as those conventionally referred to as multiple-angle-projection reconstruction, and spin warp to acquire spatially resolvable NMR information.

A refinement of the technique to localize the NMR signal to a particular volume of interest (such as a slice, for example), rather than the sample volume lying within the field of the RF coil, is to utilize RF excitation pulses which are modulated to have a predetermined frequency content. Such RF pulses applied in the presence of magnetic field gradients are effective in exciting nuclear spins situated in preselected regions of the sample having resonant frequencies as predicted by the afore-described larmor equation. Radio frequency pulses modulated in this manner are referred to as being "selective." These should be contrasted to non-selective RF pulses which are applied in the absence of magnetic field gradients, as disclosed hereinbefore, and which affect all of the nuclear spins in the field of the coil.

It will be therefore recognized that judicious choice of RF and gradient pulses permits NMR information to be acquired from any preselected plane within the object. Typically, it is possible to collect NMR data to permit image reconstruction in any of three orthogonal planes of the object. The primary planes are generally referred to as the coronal, axial, and sagittal planes. The NMR data acquisition process is, however, not limited to these planes but is capable of acquiring data from oblique planes as well. With such multiplanar data-acquisition capability, it is desirable to test system operation in at least some representative orientations (e.g., coronal, sagittal, and axial planes). If performance is satisfactory for these, it can then be assumed that the system will operate satisfactorily in other orientations. This should be contrasted to CT where imaging information is acquired by measuring x-ray attenuation through the object slice of interest in a single transverse plane coincident with the plane of the x-ray beam. In CT, only if several contiguous planes are scanned, by advancing the object through the x-ray beam, can images corresponding to other orientations be calculated indirectly. In CT, therefore, there is no need for multiplanar system test capability.

Thus, it is apparent that a need exists in NMR for a phantom having the capability to provide multiplanar test data regarding NMR system operation without requiring the phantom to be repositioned, and with ease and low cost as described hereinbefore. The phantom should also provide a multi-parameter testing capability. It is, therefore, a principal object of the present invention to provide such a phantom.

SUMMARY OF THE INVENTION

In accordance with the invention, there is provided a phantom for testing the performance of an NMR scanner having the capability of acquiring NMR data from nuclei situated in a plurality of planes within an object. The phantom includes at least first and second test plates each including means useful in testing at least one performance parameter of the NMR scanner. The test plates are arranged relative to one another so as to be simultaneously positionable in use at the isocenter of the NMR scanner to enable testing NMR scanner performance in each of the planes containing the test plate without the need to reposition the phantom.

In the preferred embodiment, the phantom is made up of three mutually orthogonal test plates which enable NMR scanner performance to be tested in each of the axial, sagittal and coronal planes without requiring the phantom to be repositioned.

BRIEF DESCRIPTION OF THE DRAWINGS

The features of the invention believed to be novel are set forth with particularly in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
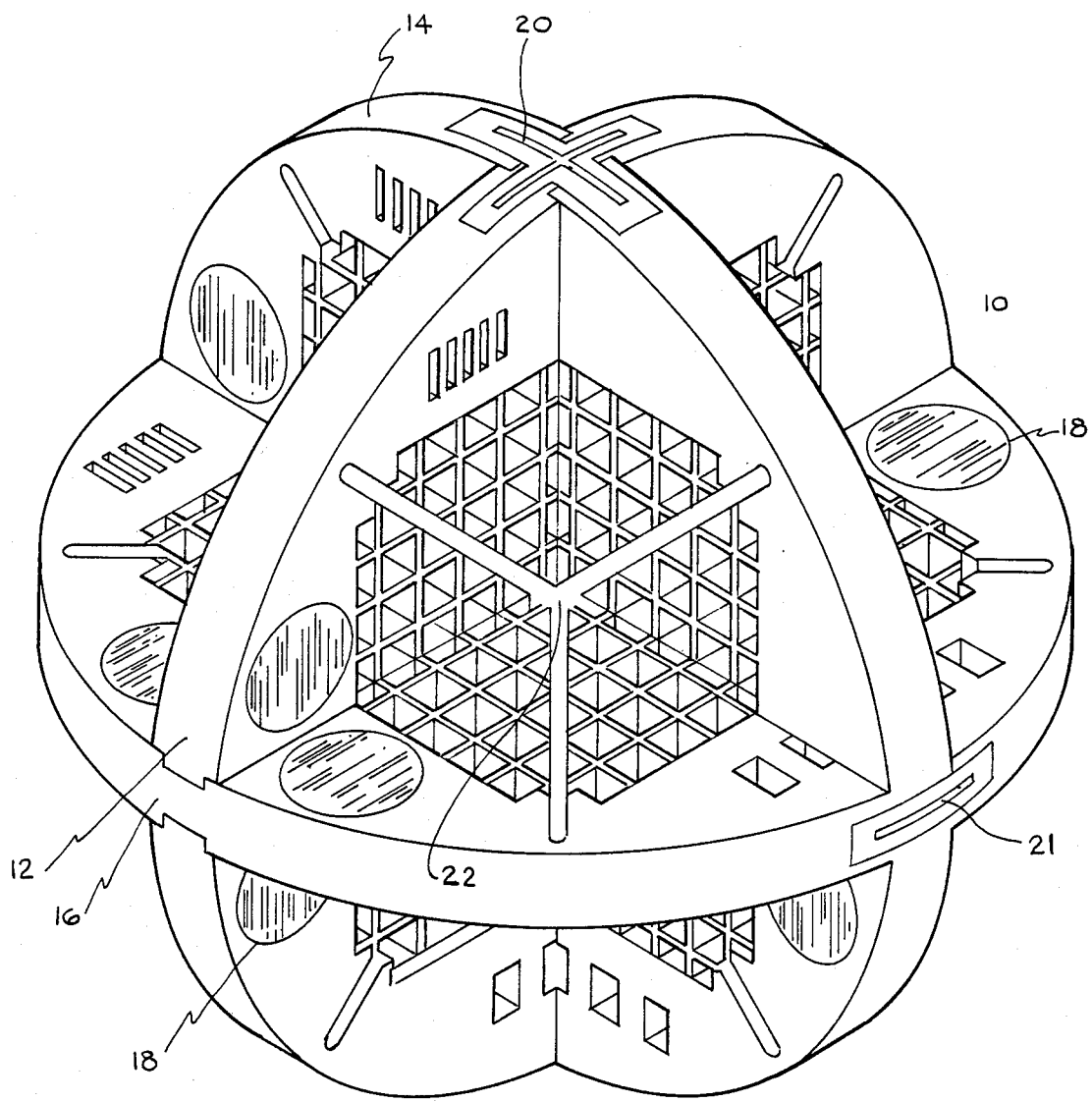
FIG. 1 is a perspective view of the inventive phantom.

Referring to FIG. 1, there is shown a perspective view of the inventive three-dimensional NMR phantom, generally designated by reference numeral 10. The phantom comprises three mutually orthogonal test plate elements 12, 14, and 16 useful in testing NMR system parameters in the sagittal, axial, and coronal planes, respectively. The test plates are fabricated from materials compatible with NMR applications. Such materials are, for example, non-metallic, non-magnetic, and non-hydroscopic. Suitable materials include various types of polycarbonate, acrylic, and polystyrene plastics. Acrylic materials are preferred due to their desirable bonding and machining properties. In the embodiment depicted in FIG. 1, test plates 12, 14, and 16 are shown as having a circular configuration so that the assembled phantom is spherical. It will be recognized, of course, that the circular/spherical geometry is merely exemplary and, in fact, other suitable geometries may be advantageously employed. For example, in the embodiment depicted in FIG. 3 (which will be described in greater detail hereinafter) sagittal plate 12 and coronal plate 16 both have a rectangular configuration.

Regardless of the geometry selected, the test plates are enclosed in a protective shell having the appropriate configuration (e.g., spherical or rectangular). The shell, which may be fabricated from any of the suitable materials described hereinabove, is not shown to preserve figure clarity. In a completed phantom, the shell is filled with an NMR-active substance, preferably a liquid such as one of the glycerine, copper sulfate, or magnesium chloride solution. The fluid simulates in-vivo tissue, while the areas without liquid simulate substantially non-NMR-active regions, such as bone. For example, the fluid acts to absorb radio-frequency energy, and emits NMR signals in a manner which approximates a human head. Other areas in the test plate (such as those designated 18 in FIG. 1) may be filled with fluids or gels which differ in their NMR properties providing additional flexibility and utility in the use of the phantom.

Continuing with reference to FIG. 1, a position marker 20, comprised of two orthogonal alignment lines, is provided, preferably on the phantom shell, so as to locate the center of intersection between the axial and sagittal test plates 14 and 12, respectively. Another position marker 21 is provided laterally on coronal plate 16. A similar marker (not visible in FIG. 1) is provided on the side of the coronal plate opposite that on which marker 21 is located. Overhead and lateral laser patient alignment lights (not shown), which typically form part of the NMR scanner, can then be used in conjunction with position markers 20 and 21, respectively, to align center 22 of the phantom with the center of the homogeneous region of magnetic field $B_o$ located within the magnet bore and commonly referred to as the system isocenter. The isocenter also coincides with the zero gradient point corresponding to the intersection of the $G_x$, $G_y$, and $G_z$ gradient magnetic fields discussed previously. When aligned with the isocenter, the phantom is positioned such that the coronal, sagittal, and axial plates can be imaged by the NMR scanner without repositioning the phantom. The position markers enable the phantom to be identically repositioned within the NMR system as daily calibration studies are performed, thereby enabling meaningful comparison of day-to-day calibration tests. Such tests are useful in determining whether system performance has departed from pre-established levels.

Figure 2:
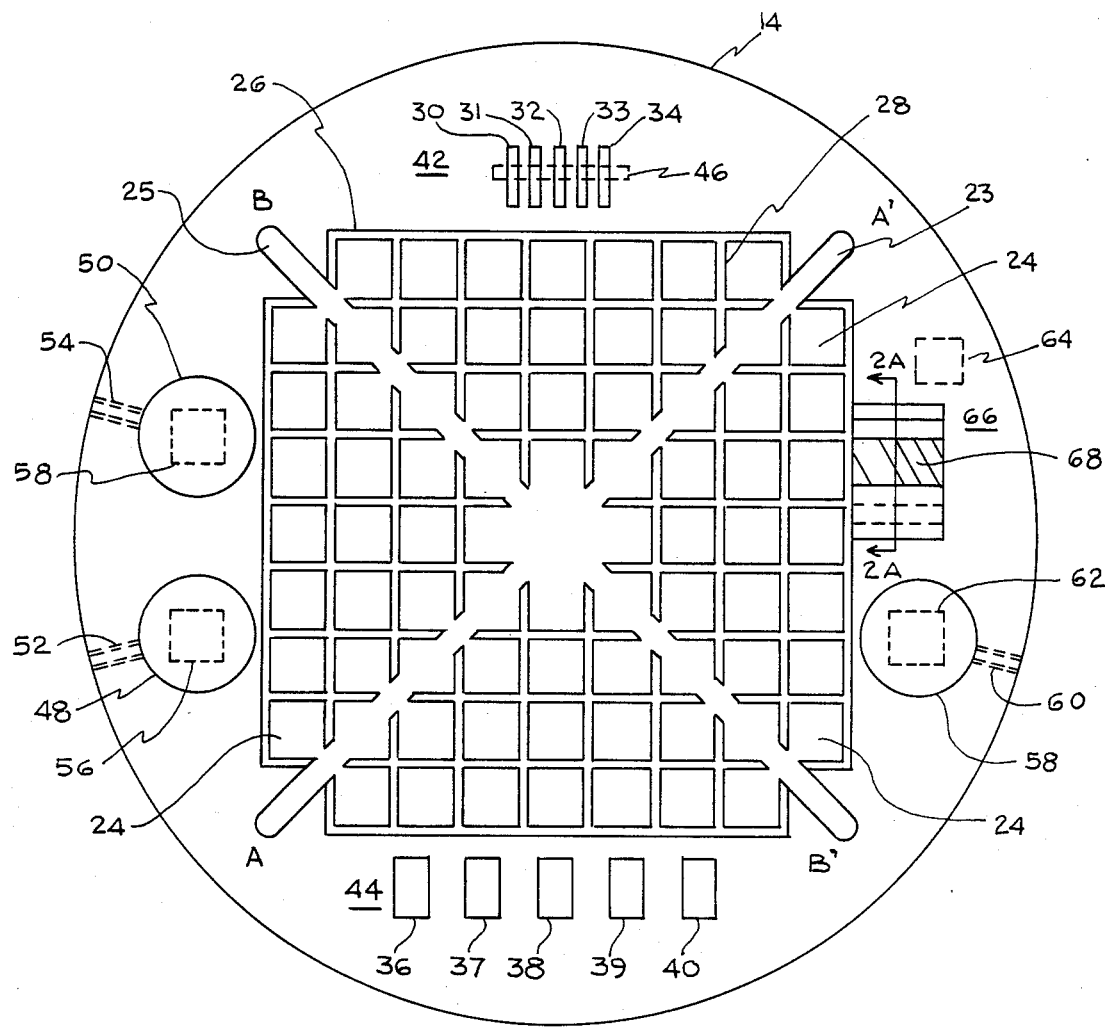
FIG. 2 is a front view of a single element of the inventive phantom illustrating details of construction.

The detailed construction of one embodiment of a test plate will be disclosed next by way of example with reference to axial test plate 14 (FIG. 1), a front view of which is depicted in FIG. 2. It will be, of course, understood that functionally test plates 12 and 16 are substantially identical to plate 14. Referring now to FIG. 2, test plate 14 may comprise a circular member having a diameter of, for example, 8.75 inches and being 0.75 inch thick. An array of square cells, such as those designated 24, is disposed in a generally square area located on the face of test plate 14. The cells are created by sets of narrow, parallel dividers 26 which are arranged orthogonal to a second set of parallel dividers 28. The cells are adapted for holding an NMR-active liquid used to fill the protective shell in a completed phantom. The array comprises an image distortion grid and is used to visually (or through computer image analysis) inspect the image for warping or distortion in the square apertures. The distortion grid is composed of straight lines due to the fact that the human eye is particularly sensitive to irregularities in straight-line patterns. Such irregularities would be indicative of non-uniformities in the main magnetic field $B_o$ or the $G_x$, $G_y$, and $G_z$ gradient fields. It will be, of course, recognized that the exact configuration need not be as described. All that is required is a substantially rectilinear pattern in which warped or distorted lines are easily recognizable.

Referring again to FIG. 2, the image distortion grid described above is divided into four substantially triangularly-shaped areas by a pair of diagonal channels 23 and 25, the extremes of which are designated A, A', and B, B', respectively. These channels are used to perform an image uniformity test. The test is accomplished by locating a line N-pixels wide along each of the diagonal areas between points A-A' and B-B'. The standard deviation of the pixel values is then calculated and compared to values previously set for the system. Departures from the preset values would be indicative of non-uniformity in the $B_o$, $B_1$, $G_x$, $G_y$, and $G_z$ magnetic fields.

Test plate 14 also includes two high contrast resolution grids, generally designated 42 and 44, each made up of a series of regularly shaped cells 30-34 and 36-40, respectively, which are filled with an NMR-active fluid. In the preferred embodiment, these cells (as well as those of the image distortion grid) are in liquid communication with the remainder of the phantom so that the fluid held within the protective shell fills the cells. In pattern 42, the cells are more closely spaced than those of pattern 44 and are designed to test for fine resolution using, for example, a head radio-frequency coil which is capable of higher resolution than the body radio-frequency coils. Test pattern 44, having wider separations than pattern 42, is used to test for resolution in body images.

The manner in which the resolution test is performed is identical for both patterns and will be described by way of example with reference to pattern 42. To perform the test, pixel values in a line, such as the one designated by reference numeral 46, N pixels wide, are sampled. The percent modulation of the pixel values along line 46 is then calculated. The percent modulation is the total range of pixel values divided by the modulation range of the values. The higher the percent of modulation, the higher the resolution. Again, comparison the test value is compared to a previously recorded file value to determine whether a change in resolution has occurred which may be indicative of sub-standard system performance.

Test plate 14 is also provided with special compartments 48 and 50 which are isolated from the fluid used to fill the protective shell. Compartments 48 and 50 are used in performing a contrast ratio test. Compartments 48 and 50 are filled through openings 52 and 54, respectively, with a specific NMR-active gel or liquid material having $T_1$, $T_2$, and nuclear spin-density constants comparable to those of human tissue over a range of $B_o$ magnetic field strengths of between about 0.35 tesla and 2.0 tesla. Moreover, the materials are selected to have different NMR constants relative to one another. Additionally, the constant values for each material are selected to fall into different parts of the range of $T_1$, $T_2$, and spin-density values for human tissue. The materials must also be selected so as to be non-toxic, inert with respect to the material from which the phantom is constructed and must also be temporally stable. Reagent grade materials are preferred to ensure quality uniformity. It has been found that solutions of reagent grade glycerine with water to achieve 85% and 15% glycerine concentrations work satisfactorily.

The contrast ratio is determined by defining areas 56 and 58 in compartments 48 and 50, respectively, and calculating the means pixel values in each area. The contrast ratio is the quotient of the sum of mean pixel values in areas 56 and 58 and the difference therebetween.

A third compartment 58, similar to compartments 48 and 50, is provided in test plate 14 and is used in calculating the signal-to-noise ratio (S/N). This is accomplished by introducing an NMR-active material (such as 100% glycerine) into compartment 58 through a fill opening 60. The signal-to-noise ratio is then calculating by locating an area, such as that designated 62, centered in compartment 58 and an area 64 comprising material which forms part of test plate 14 and, therefore, is substantially non-NMR active. The signal-to-noise ratio is determined by calculating the mean pixel values in area 62 and dividing by the standard deviation of area 64.

Figure 2A:
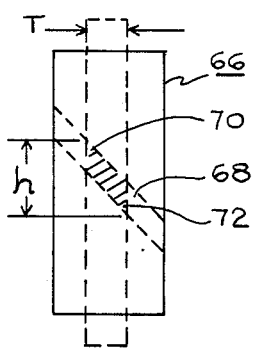
FIG. 2A is a sectional view taken along line 2A—2A shown in FIG. 2.

The thickness of the selected imaging slice can be tested by a means generally designated 66 in FIG. 2, a sectional view of which, taken along line 2A—2A, is shown in FIG. 2A. Referring now to FIGS. 2 and 2A, means 66 is provided with a slot 68 which is adapted for holding an NMR-active fluid. As best seen in FIG. 2A, slice thickness, designated "T" is related to the height "h" of slot 68. The slice thickness is determined by considering that the NMR signal originates from the shaded portion of slot 68 as shown in FIG. 2A. The NMR signal is small in regions 70 and 72 and increases toward the center of the shaded region as would be expected due to increased volume of NMR-active fluid in that region. The slice thickness is determined by taking the full width half maximum (FWHM) of the resulting signal profile waveform.

Figure 3:
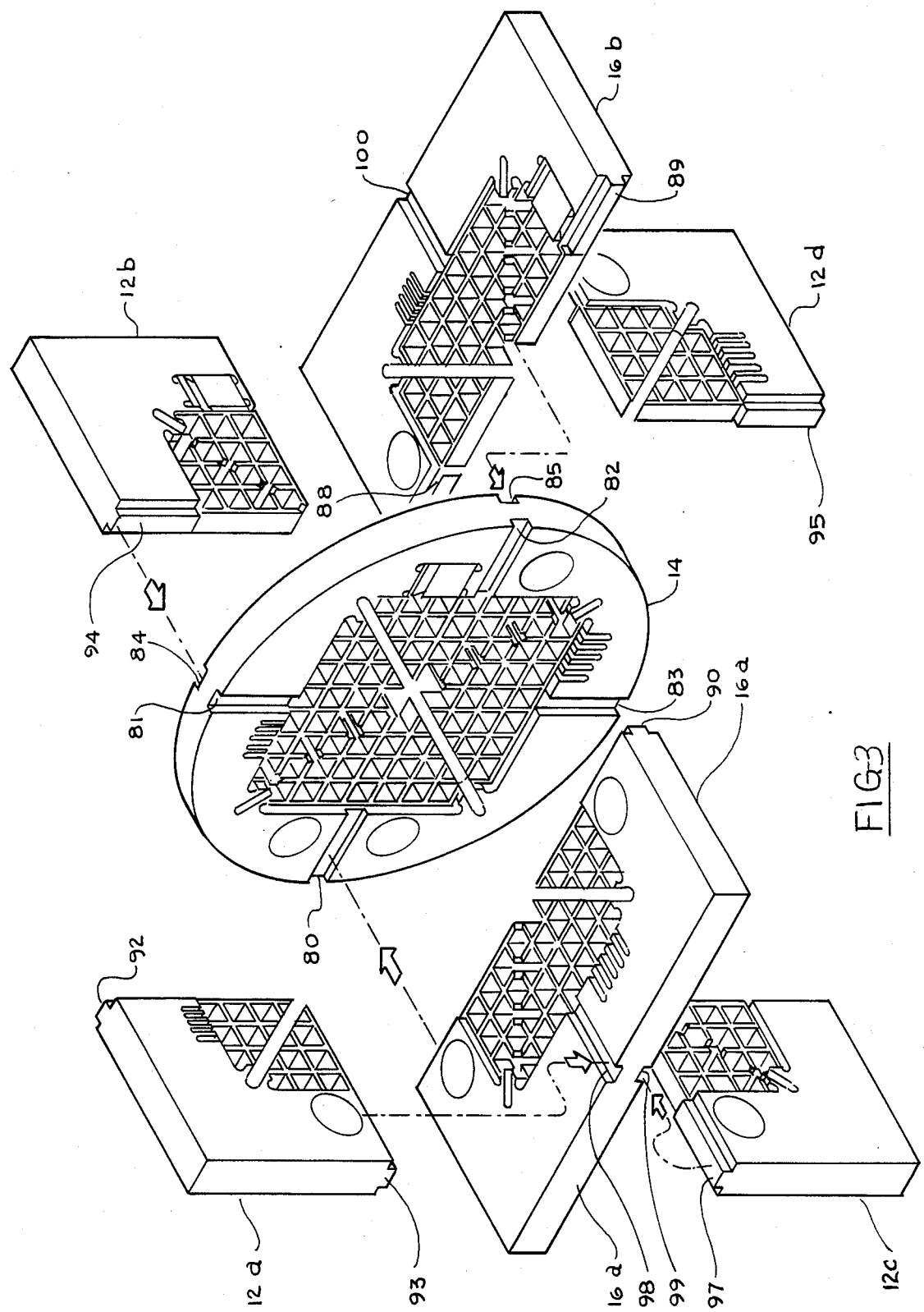
FIG. 3 is an exploded view of the new phantom illustrating the manner in which the constituent elements are configured for assembly in one embodiment of the invention.

The phantom can be constructed by any convenient method following any desired assembly procedure. FIG. 3 depicts an exploded view of one possible assembly technique. For example, axial test plate 14 may be fabricated as a single circular piece, while coronal plate 16 can be fabricated as two pieces 16a and 16b and sagittal plate 12 is fabricated from four pieces 12a, 12b, 12c, and 12d. A set four grooves 80-83 is provided on the face of plate 14 visible in FIG. 3. Test plate 14 is provided on its other surface with a similar set of grooves (of which only those designated 84 and 85 are visible) in general alignment with slots 80-83. Test plate halves 16a and 16b, which form part of the coronal test plate 16, are each provided with a set of tongues, visible ones of which are designated 88-90, which are sized to fit into the grooves machined in axial plate 14. Thus, for example, groove 82 and tongue 90 form one joint when bonded, while groove 85 and tongue 89 form another.

Similarly, elements 12a-12d, comprising sagittal plate 12 in the assembled phantom, are provided with tongues which are sized to fit grooves formed in the coronal plate 16 and in axial plate 14. Thus, by way of example, element 12a is provided with tongues 92 and 93 which fit into grooves 81 and 98, respectively, formed in the axial and coronal plates, respectively. Elements 12b–12d are provided with similar tongues which fit into grooves provided in the axial and coronal plates and are assembled in a manner identical to that described with reference to element 12a.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A phantom for testing the performance of an NMR scanner having the capability of acquiring NMR data from nuclei situated in a plurality of planes within a test object, said phantom comprising:
   at least first and second test-plate means each including means for testing at least one performance parameter of the NMR scanner, said test-plate means lying in first and second planes and being arranged relative to one another so as to have at least a common center point positionable in use at the isocenter of the NMR scanner to enable NMR scanner performance tests to be performed in each of the planes containing said test plates without repositioning the phantom.

2. The phantom of claim 1 further comprising a third test-plate means including means for testing at least one performance parameter of the NMR scanner, said third test-plate means lying in a third plane and having a common center point with said first and second test-plate means, said center point being positionable in use at the isocenter of the NMR scanner to enable NMR scanner performance tests to be performed in each of the planes containing said test plates without repositioning said phantom.

3. The phantom of claim 2 wherein said test-plate means are perpendicular to one another.

4. The phantom of claim 3 wherein said first, second, and third planes correspond to the axial, sagittal and coronal planes of said test object.

5. The phantom of claims 1, 2, 3, or 4 further comprising a shell for enclosing said test-plate means, said shell being capable of confining therein an NMR-active material.

6. The phantom of claim 5 further comprising position marker means to enable said phantom to be identically repositioned within said scanner in the course of performing a plurality of temporally spaced NMR scanner performance tests.

7. The phantom of claim 5 wherein said means for testing comprises an image distortion grid made up of a plurality of cells fabricated in a rectilinear pattern on the face of said test-plate means and adapted for holding an NMR-active material.

8. The phantom of claim 7 wherein said plurality of cells is in fluid communication with the interior of said shell.

9. The phantom of claim 5 wherein said means for testing comprises means for testing image uniformity, said means for testing image uniformity including at least one channel filled with an NMR-active material, which channel is fabricated in a substantially straight line across the face of said test-plate means.

10. The phantom of claim 9 wherein said channel is in fluid communication with the interior of said shell.

11. The phantom of claim 5 wherein said means for testing comprises at least one image resolution grid made up of a series of cells fabricated a predetermined distance from one another on the face of said test-plate means and being adapted for holding an NMR-active material.

12. The phantom of claim 11 wherein said series of cells are in fluid communication with the interior of said shell.

13. The phantom of claim 5 wherein said means for testing comprises means for performing a contrast ratio test, said last-mentioned means including a plurality of compartments for holding NMR-active materials which differ in their NMR properties from one another and from the NMR-active material containable in said shell.

14. The phantom of claim 13 wherein said NMR-active material in each of said compartments comprises one of glycerine and aqueous solutions thereof.

15. The phantom of claim 5 wherein said means for testing comprises at least one compartment isolated from the interior of said shell and capable of holding an NMR-active material which differs in its NMR properties from the NMR-active material containable in said shell.

16. The phantom of claim 5 wherein said means for testing comprises means useful for determining the signal-to-noise ratio.

17. The phantom of claim 5 wherein said means for testing comprises means useful for determining the thickness of a slice in said test object selected for imaging.

* * * * *